United States Patent
Kitaura et al.

(10) Patent No.: US 11,139,419 B2
(45) Date of Patent: Oct. 5, 2021

(54) METHOD FOR PRODUCING SEALED OPTICAL SEMICONDUCTOR DEVICE

(71) Applicants: Dow Corning Toray Co., Ltd., Tokyo (JP); Dow Silicones Corporation, Midland, MI (US)

(72) Inventors: Eiji Kitaura, Chiba (JP); Masaaki Amako, Chiba (JP); Steven Swier, Midland, MI (US)

(73) Assignees: DuPont Toray Specialty Materials Kabushiki Kaisha, Tokyo (JP); Dow Silicones Corporation, Midland, MI (US)

( * ) Notice: Subject to any disclaimer, the term of this patent is extended or adjusted under 35 U.S.C. 154(b) by 0 days.

(21) Appl. No.: 16/634,808

(22) PCT Filed: Aug. 31, 2018

(86) PCT No.: PCT/JP2018/032432
§ 371 (c)(1),
(2) Date: Jan. 28, 2020

(87) PCT Pub. No.: WO2019/049794
PCT Pub. Date: Mar. 14, 2019

(65) Prior Publication Data
US 2020/0373457 A1    Nov. 26, 2020

(30) Foreign Application Priority Data

Sep. 8, 2017  (JP) .............................. JP2017-172928

(51) Int. Cl.
*H01L 33/52*     (2010.01)
*H01L 33/56*     (2010.01)

(52) U.S. Cl.
CPC .............. *H01L 33/52* (2013.01); *H01L 33/56* (2013.01); *H01L 2933/005* (2013.01); *H01L 2933/0041* (2013.01)

(58) Field of Classification Search
CPC ......... H01L 33/52; H01L 33/54; H01L 33/56; H01L 2933/0041; H01L 2933/005
See application file for complete search history.

(56) References Cited

U.S. PATENT DOCUMENTS 8,547,011 B2   10/2013   Yamada et al.
8,597,988 B2   12/2013   Shaikevitch et al.
(Continued)

FOREIGN PATENT DOCUMENTS

CN    104170101       11/2014
CN    104170101 A     11/2014
(Continued)

OTHER PUBLICATIONS

International Search Report for Application No. PCT/JP2018/032432 dated Oct. 9, 2018, 2 pages.
(Continued)

*Primary Examiner* — Zandra V Smith
*Assistant Examiner* — Molly K Reida
(74) *Attorney, Agent, or Firm* — Howard & Howard Attorneys PLLC

(57) ABSTRACT

A method for producing a sealed optical semiconductor device makes it possible to seal an optical semiconductor element using a sealing film. The method includes: placing a sealing film on an optical semiconductor element substrate on which an optical semiconductor element is placed within a pressure reduction chamber, and the pressure within the chamber is reduced; heating the film where at least the periphery of the film is thermally fused to the surface of the optical semiconductor element placement substrate; and a (Continued)

step in which the reduction of pressure within the chamber is released and the optical semiconductor element placement substrate is sealed by the film. The temperature $T_2$ of the optical semiconductor element placement substrate when the reduction of pressure within the chamber is released is a temperature at which the film exhibits a tensile strength of 0.02-0.15 MPa and an elongation at break of 150-450%.

17 Claims, 2 Drawing Sheets

(56) References Cited

U.S. PATENT DOCUMENTS

| | | | |
|---|---|---|---|
| 9,950,468 | B2 | 4/2018 | Shaikevitch et al. |
| 10,014,108 | B2 | 7/2018 | Petrzilek et al. |
| 2008/0018230 | A1 | 1/2008 | Yamada et al. |
| 2012/0126281 | A1 | 5/2012 | Shaikevitch et al. |
| 2013/0319607 | A1 | 12/2013 | Shaikevitch et al. |
| 2015/0041841 | A1 | 2/2015 | Basin et al. |
| 2015/0076458 | A1 | 3/2015 | Lee et al. |
| 2015/0321387 | A1 | 11/2015 | Bravet et al. |
| 2016/0108240 | A1 | 4/2016 | Kashiwagi et al. |

FOREIGN PATENT DOCUMENTS

| | | |
|---|---|---|
| CN | 107995920 | 5/2018 |
| CN | 107995920 A | 5/2018 |
| EP | 1745922 A1 | 1/2007 |
| EP | 2837040 A1 | 2/2015 |
| JP | H 05-110256 | 4/1993 |
| JP | H05110256 A | 4/1993 |
| JP | H 06-190956 | 7/1994 |
| JP | H06190956 A | 7/1994 |
| JP | 2016-171314 | 9/2016 |
| JP | 2016-171325 | 9/2016 |
| JP | 2016171314 A | 9/2016 |
| JP | 2016171325 A | 9/2016 |
| JP | 2016-201546 | 12/2016 |
| JP | 2016201546 A | 12/2016 |
| KR | 2007-0024547 | 3/2007 |
| KR | 20070024547 A | 3/2007 |
| KR | 2015-0001766 | 1/2015 |
| KR | 20150001766 A | 1/2015 |
| KR | 2016-0150657 | 12/2016 |
| KR | 20160150657 A | 12/2016 |
| TW | 201728739 | 8/2017 |
| TW | 201728739 A | 8/2017 |
| WO | 2005105428 A1 | 11/2005 |
| WO | WO 2005/105428 | 11/2005 |
| WO | 2012023119 A1 | 2/2012 |
| WO | 2013154602 A1 | 10/2013 |
| WO | 2015068652 A1 | 5/2015 |
| WO | WO 2015/068652 A1 | 5/2015 |
| WO | 2016065016 A1 | 4/2016 |
| WO | 2017057074 A1 | 4/2017 |
| WO | WO 2017/057074 | 4/2017 |

OTHER PUBLICATIONS

International Search Report for Application No. PCT/JP2018/032424 dated Oct. 9, 2018, 2 pages.
English language abstract for CN 104170101 extracted from espacenet.com database on Feb. 24, 2020, 2 pages.
English language abstract and machine-assisted English translation for CN 107995920 extracted from espacenet.com database on Feb. 24, 2020, 47 pages.
English language abstract and machine-assisted English translation for JPH 05-110256 extracted from espacenet.com database on Feb. 24, 2020, 4 pages.
English language abstract and machine-assisted English translation for JPH 06-190956 extracted from espacenet.com database on Feb. 24, 2020, 6 pages.
English language abstract and machine-assisted English translation for JP 2016-171314 extracted from espacenet.com database on Feb. 24, 2020, 34 pages.
English language abstract for JP 2016-171325 extracted from espacenet.com database on Feb. 24, 2020, 1 page.
English language abstract for JP 2016-201546 extracted from espacenet.com database on Feb. 24, 2020, 2 pages.
English language abstract for KR 2007-0024547 extracted from espacenet.com database on Feb. 24, 2020, 1 page.
English language abstract for KR 2015-0001766 extracted from espacenet.com database on Feb. 24, 2020, 2 pages.
English language abstract for KR 2016-0150657 extracted from espacenet.com database on Feb. 24, 2020, 2 pages.
English language abstract and machine-assisted English translation for TW 201728739 extracted from espacenet.com database on Feb. 24, 2020, 41 pages.
English language abstract for WO 2005/105428 extracted from espacenet.com database on Feb. 24, 2020, 1 page.
English language abstract and machine-assisted English translation for WO 2017/057074 extracted from espacenet.com database on Feb. 24, 2020, 41 pages.
U.S. Appl. No. 16/634,808, filed Jan. 28, 2020.
English language abstract and machine-assisted English translation for WO 2015/068652 A1 extracted from espacenet.com database on May 13, 2021, 17 pages.

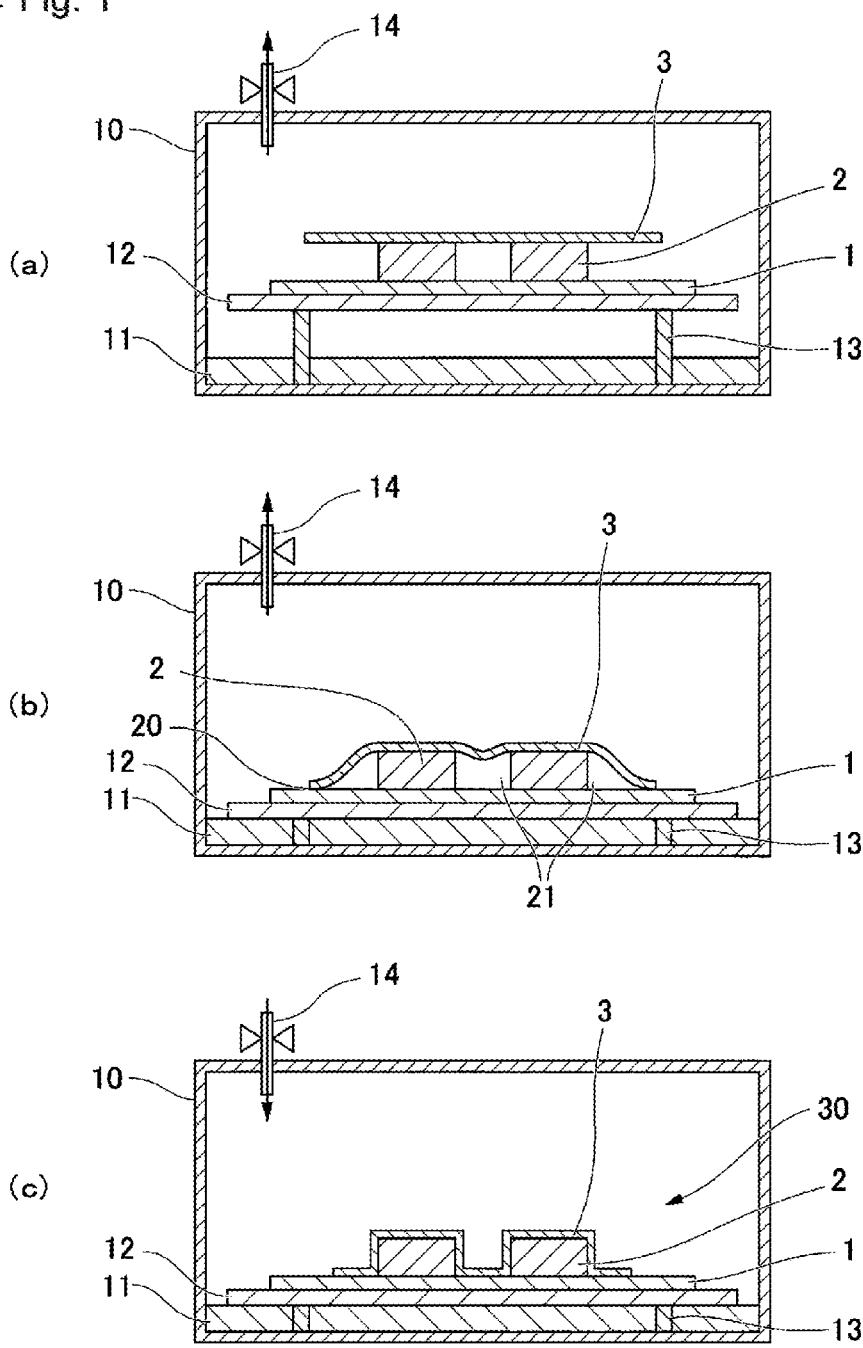

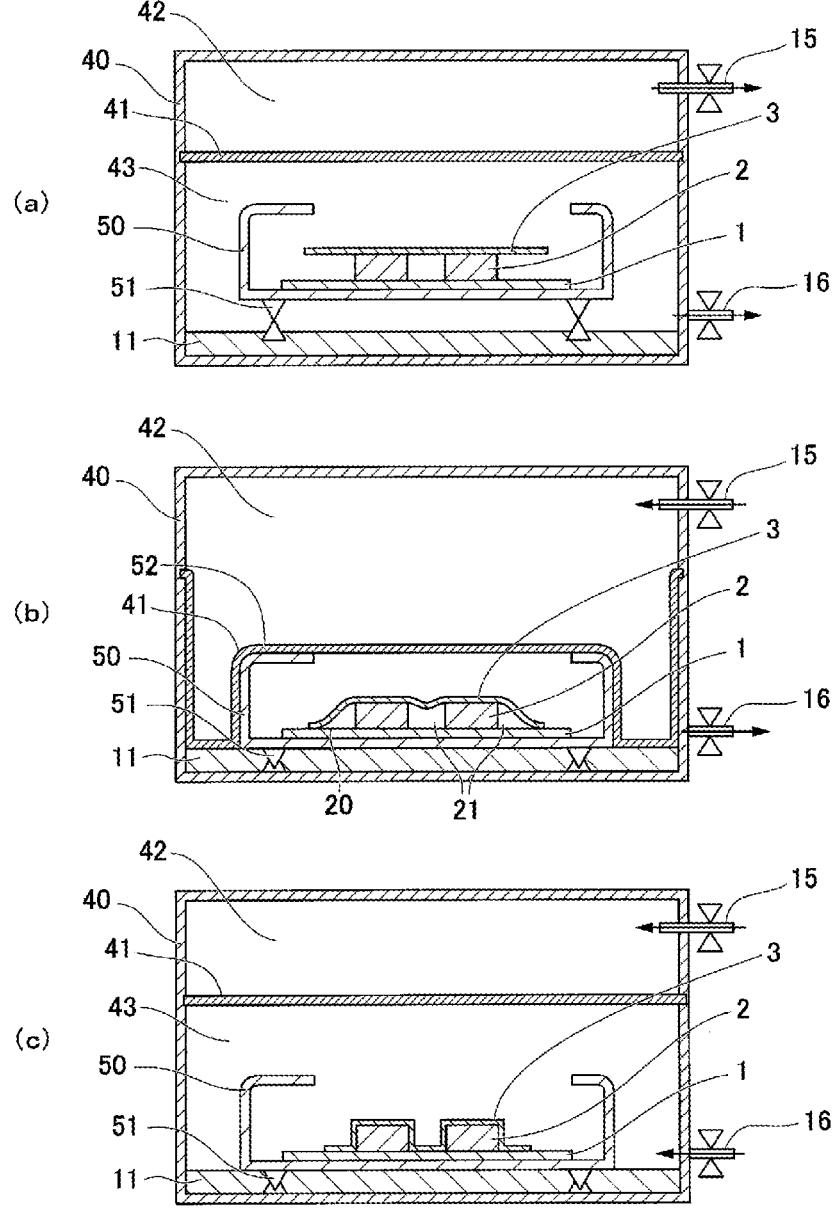

METHOD FOR PRODUCING SEALED OPTICAL SEMICONDUCTOR DEVICE

RELATED APPLICATIONS

The present application is the National Stage of International Patent Application No. PCT/JP2018/032432, filed on Aug. 31, 2018, which claims priority to and all the benefits of Japanese Patent Application No. 2017-172928, filed on Sep. 8, 2017, which are hereby expressly incorporated herein by reference in their entirety.

TECHNICAL FIELD

The present invention relates to a method for producing a sealed optical semiconductor device, using a sealing film.

BACKGROUND ART

In optical semiconductor devices on which an optical semiconductor element, such as a photocoupler, light emitting diode, or solid-state imaging device is mounted, the optical semiconductor element is sealed using a sealant in order to improve the reliability of the optical semiconductor element. Known methods for sealing optical semiconductor devices include sealing methods using sealing films.

For example, Patent Document 1 discloses a method for producing an LED device by: mounting at least one LED element on a substrate; disposing, over the aforementioned LED element, a lamination layer of a predetermined shape, having a first and a second surface, the first surface including a binder supported on a base film and phosphor particles; heating the lamination layer to a first temperature, to soften the lamination layer and form a gastight seal between the lamination layer and the substrate surrounding the LED element; then, after removing the base film, heating the lamination layer to a second temperature under reduced pressure so as to remove air between the lamination layer and the substrate; and subsequently shaping the lamination layer that covers the LED element by pressing the lamination layer against the substrate by way of returning to atmospheric pressure.

Patent Document 2 discloses a vacuum lamination method including a single heating step of heating a central portion of a lamination layer having a predetermined shape so as to produce a flowable state, before an article such as a light-emitting diode array, which has been placed in an inner portion of a first surface of a substrate wafer, is conformally coated with the aforementioned lamination layer, and which includes a step of arranging a central portion of the lamination layer, which has been heated so as to produce a flowable state, so as to be spaced apart from the aforementioned inner portion of the first surface, by way of a gastight sealed inner region constituted by a gastight seal, which is formed by an edge portion of the aforementioned lamination layer and an outer portion of the first surface, and by the aforementioned lamination layer and the aforementioned first surface.

Patent Document 3 discloses a method for producing a sealed optical semiconductor element characterized by comprising: a sealing sheet preparation step of preparing a sealing sheet, which is a sealing sheet comprising a sealing layer, and is used to seal an optical semiconductor element, wherein a curve showing a relationship between a temperature T and a storage shear modulus G' obtained by measuring the dynamic viscoelasticity of the aforementioned sealing layer under conditions of a frequency of 1 Hz and a temperature rise rate of 10° C./min, has a minimum value, and the temperature T at the aforementioned minimum value is in the range of not less than 60° C. and not more than 200° C. and, furthermore, the storage shear modulus G' at the aforementioned minimum value is in the range of not less than 5 Pa and not more than 1000 Pa; an element preparation step of preparing an optical semiconductor element disposed on a substrate; and a hot press step of hot pressing the aforementioned sealing sheet against the aforementioned optical semiconductor element at a temperature of not less than 60° C. and not more than 200° C.

Patent Document 4 discloses a method for producing an adhering optical semiconductor element characterized by comprising: an adherent sheet preparation step of preparing an adherent sheet, which is an adherent sheet comprising an adherent layer, and is used so as to be directly or indirectly adhered to an optical semiconductor element, wherein a curve showing a relationship between a temperature T and a storage shear modulus G' obtained by measuring the dynamic viscoelasticity of the aforementioned adherent layer under conditions of a frequency of 1 Hz and a temperature rise rate of 20° C./min, has a minimum value, and the temperature T at the aforementioned minimum value is in the range of not less than 40° C. and not more than 200° C. and, furthermore, the storage shear modulus G' at the aforementioned minimum value is in the range of not less than 1000 Pa and not more than 90,000 Pa; an element preparation step of preparing an optical semiconductor element disposed on a substrate; and a hot press step of directly or indirectly hot pressing the aforementioned adherent sheet against the optical semiconductor element at a temperature of not less than 40° C. and not more than 200° C.

PRIOR ART DOCUMENTS

Patent Documents

Patent Document 1: WO 2012/023119
Patent Document 2: WO 2016/065016
Patent Document 3: JP 2016-171314A
Patent Document 4: JP 2016-171315A

SUMMARY OF THE INVENTION

Problems to be Solved by the Invention

However, there is a demand for a method for producing a sealed optical semiconductor device, with which an optical semiconductor element can be more easily sealed, using a sealing film.

An object of the present invention is to provide a method for producing a sealed optical semiconductor device, with which an optical semiconductor element can be sealed simply and highly reliably, using a sealing film.

Means for Solving the Problems

The present inventors undertook intensive study in order to solve the problems described above, and found that, when sealing an optical semiconductor element, using a sealing film, it is possible to seal an optical semiconductor element mounted on a substrate, simply and highly reliably, by way of performing a lamination step under specific temperature conditions, and thus the present invention was completed.

The method for producing a sealed optical semiconductor device according to the present invention is characterized by including:

a step of placing a sealing film on an optical semiconductor element mounting substrate on which an optical semiconductor element is mounted, in a pressure reduction chamber, and reducing the pressure within the pressure reduction chamber;

a step of heating the sealing film so that at least a peripheral portion of the sealing film is thermally fused to a surface of the optical semiconductor element mounting substrate; and a step of releasing the reduced pressure within the pressure reduction chamber so as to seal the optical semiconductor element mounting substrate with the sealing film, wherein the temperature $T_2$ of the optical semiconductor element mounting substrate when the reduced pressure within the pressure reduction chamber is released is a temperature at which the sealing film exhibits a tensile strength of 0.02 to 0.15 MPa and an elongation at break of 150 to 450%.

In the method for producing a sealed optical semiconductor device of the present invention, the sealing film is preferably made of a thermosetting silicone resin.

In the method for producing a sealed optical semiconductor device of the present invention, if the sealing film contains a phosphor, the sealing film preferably contains not more than 90 mass % of the phosphor.

In the method for producing a sealed optical semiconductor device of the present invention, the sealing film preferably has a thickness of not less than 10 μm and not more than 300 μm.

In the method for producing a sealed optical semiconductor device of the present invention, the temperature $T_2$ is preferably not less than 70° C. and not more than 180° C.

In the method for producing a sealed optical semiconductor device of the present invention, the minimum distance between the optical semiconductor elements is preferably greater than the thickness of the sealing film.

In the method for producing a sealed optical semiconductor device of the present invention, the aspect ratio (T/L) between the height T of the optical semiconductor element and the distance L between the optical semiconductor elements is preferably, at a maximum, not more than 3.

Effects of the Invention

The method for producing a sealed optical semiconductor device of the present invention is characterized in that the sealed optical semiconductor device can be produced easily and highly reliably.

BRIEF DESCRIPTION OF DRAWINGS

FIG. 1 is a schematic cross-sectional view illustrating one example of a method according to the present invention implemented using a vacuum laminator having a lift-pin elevation mechanism.

FIG. 2 is a schematic cross-sectional view illustrating one example of a method according to the present invention implemented using a diaphragm-type vacuum laminator and a lamination jig.

MODES FOR CARRYING OUT THE INVENTION

Hereafter, modes of embodiment of the present invention will be described in detail. The present invention is not limited to the following modes of embodiment, but rather may be carried out with various modifications without departing from the scope of the gist thereof.

Method for Producing Sealed Optical Semiconductor Device

The method for producing a sealed optical semiconductor device according to the present invention is characterized by including:

(1) a step of placing a sealing film on an optical semiconductor element mounting substrate on which an optical semiconductor element is mounted, in a pressure reduction chamber, and then reducing the pressure within the pressure reduction chamber;

(2) a step of heating the sealing film so that at least a peripheral portion of the sealing film is thermally fused to a surface of the optical semiconductor element mounting substrate; and (3) a step of releasing the reduced pressure within the pressure reduction chamber so as to seal the optical semiconductor element mounting substrate with the sealing film, in which the temperature $T_2$ of the optical semiconductor element mounting substrate when the reduced pressure within the pressure reduction chamber is released is a temperature at which the sealing film exhibits a tensile strength of 0.02 to 0.15 MPa and an elongation at break of 150 to 450%.

With the present invention, which is thus configured, the step of forming a gastight space between the sealing film and the surface of the region to be sealed on the optical semiconductor element mounting substrate by the step of heating the sealing film under reduced pressure so as to thermally fuse the peripheral portion of the sealing film to the surface of the optical semiconductor element mounting substrate, and the step of sealing the optical semiconductor element mounting substrate with the sealing film by releasing the reduced pressure can be performed in consecutive operations, allowing the sealed optical semiconductor device to be produced easily. Furthermore, since the temperature $T_2$ of the optical semiconductor element mounting substrate when the reduced pressure within the pressure reduction chamber is released is set to a temperature at which the sealing film exhibits mechanical properties that allow it to cover the optical semiconductor element in a manner following the shape of the optical semiconductor element (hereinafter, also referred to as "conformal lamination"), the optical semiconductor device can be sealed highly reliably. Hereafter, each of the steps will be described in detail.

(1) The step of placing the sealing film on the optical semiconductor element mounting substrate on which an optical semiconductor element is mounted, in the pressure reduction chamber, and reducing the pressure in the pressure reduction chamber is a step in which the sealing film is placed on the optical semiconductor element mounting substrate on which an optical semiconductor element to be sealed is mounted, in the pressure reduction chamber, and then reducing the pressure in the pressure reduction chamber. The sealing film is placed on the optical semiconductor element mounting substrate at a position suitable for sealing the optical semiconductor element to be sealed.

The pressure reduction chamber is internally provided with a heating means for heating the optical semiconductor element mounting substrate and the sealing film. Preferably, the pressure reduction chamber is internally provided with a heating plate for heating the optical semiconductor element mounting substrate and the sealing film, which serves as the heating means. An example of such a pressure reduction chamber is a vacuum lamination device. In order to stabilize the process, the pressure reduction chamber is preferably provided with a mechanism for preventing the optical semiconductor element mounting substrate from contacting the heating means until the reduction of the internal pressure is completed, in order to prevent the peripheral portion of the sealing film from being thermally fused to the optical semiconductor element mounting substrate before reduction of the internal pressure is completed. There are no particular limitations on such pressure reduction chambers, and these include, for example, vacuum laminators having a lift-pin elevation mechanism. Furthermore, by using a special lamination jig, a diaphragm-type vacuum laminator can be used. For example, the lamination jig has a structure in which an elastic body such as a spring supports the optical semiconductor element mounting substrate, and is designed so that, when a rubber diaphragm membrane is in the regular position, the optical semiconductor element mounting substrate can be spaced apart from the heating means, but when pressure is applied to the rubber diaphragm membrane, the elastic body provided in the lamination jig is pressed, whereby the optical semiconductor element mounting substrate can be brought into contact with the heating means. The lamination jig has a structure that protects the optical semiconductor element mounting substrate and the sealing film so that the rubber diaphragm membrane does not directly contact the optical semiconductor element mounting substrate or the sealing film, even when the rubber diaphragm membrane presses the lamination jig.

There are no particular limitations on the optical semiconductor element, but examples thereof include a light emitting diode (LED), a semiconductor laser, a photodiode, a phototransistor, a solid-state image pickup, a light emitter and a light receiver for a photocoupler, and a light emitting diode (LED) is particularly preferred.

An optical semiconductor element mounting substrate is a substrate on which an optical semiconductor element has been mounted or installed. Materials having high light transmittance or high reflectance are preferred as such substrates. Examples of optical semiconductor element mounting substrates include: conductive metals such as silver, gold, and copper; non-conductive metals such as aluminum and nickel; thermoplastic resins in which white pigment, such as PPA and LCP, is mixed; thermosetting resins containing white pigment such as epoxy resins, BT resins, polyimide resins, and silicone resins; ceramics such as alumina and alumina nitride; and the like.

The sealing film is for sealing the optical semiconductor element that is to be sealed, and is formed by processing a sealant into a film form. A sealing film may be used alone, or two or more films may be used. When two or more sealing films are used, two or more sealing films of the same type may be used, or different types of sealing films may be used in combination.

The sealant constituting the sealing film can be made of a thermoplastic material or a thermosetting material. Such materials can be organic polymers or silicones. In terms of organic polymers, thermoplastic resins or thermosetting resins such as polyolefin resins, ethyl vinyl acetate (EVA) resins, epoxy resins, polyacrylate resins, or poly (vinyl butyral) resins can be mentioned. In terms of silicones, thermoplastic silicones or thermosetting silicones, such as hot-melt silicones or linear silicones (or "straight-chain silicones") can be mentioned. Furthermore, the silicone can also be cured by a condensation reaction, hydrosilylation reaction, or free radical reaction. According to a certain mode of embodiment, the sealing film can be made of a thermoplastic resin. According to another mode of embodiment, the sealing film can be made of a thermosetting resin.

According to yet another mode of embodiment, the sealing film may be made of a thermosetting silicone resin. For example, a sealing film disclosed in WO 2016/065016 can be used as the sealing film. Such sealing films are available under the trade names LF-1200 and LF-1201, made by Dow Corning Toray Co. Ltd.

The sealing film may be used as a transparent sealing film, or may contain a phosphor. Examples of the phosphor include, but are not limited to, yellow, red, green, and blue light-emitting phosphors which are widely used in light emitting diodes (LED) and comprise an oxide-based phosphor, an oxynitride-based phosphor, a nitride-based phosphor, a sulfide-based phosphor, an oxysulfide-based phosphor, or the like. Examples of oxide-based phosphors include yttrium, aluminum and garnet-based YAG-based green to yellow emission phosphors containing cerium ions, terbium, aluminum and garnet-based TAG-based yellow emission phosphors containing cerium ions, and silicate-based green to yellow emission phosphors containing cerium and europium ions. Examples of oxynitride-based phosphors include silicon, aluminum, oxygen, and nitrogen-based SiAlON-based red to green emission phosphors, containing europium ions. Examples of nitride-based phosphors include calcium, strontium, aluminum, silicon, and nitrogen-based CASN-based red emission phosphors, containing europium ions. Examples of sulfide-based phosphors include ZnS-based green emission phosphors, containing copper ions and aluminum ions. Examples of oxysulfide-based phosphors include $Y_2O_2S$ type red emission phosphors, containing europium ions. One or a mixture of two or more of these phosphors may be used.

There are no limitations on the average particle size of the phosphor, but this is normally in the range of not less than 1 μm, preferably not less than 5 μm, and not more than 50 μm, preferably not more than 20 μm. The average particle size can be measured, for example, by measuring the cumulative volume-average particle size ($D_{50}$) by a laser diffraction scattering particle size distribution measurement method.

There are no particular limitations on the phosphor content, but it is usually an amount that is not more than 90 mass % of the sealing film. Meanwhile, while there are no limitations in terms of a lower limit for the content thereof, an amount of not less than 50 mass % is preferred, and not less than 60 mass % is more preferred.

In terms of other optional components, reinforcing fillers such as precipitated silica or wet silica, fumed silica, fillers obtained by hydrophobizing these fillers with organosilicon compounds such as organohalosilane, organoalkoxysilane, hexaorganodisilazane, and inorganic extender fillers such as alumina, calcined silica, titanium oxide, glass, quartz, aluminosilicate, iron oxide, zinc oxide, calcium carbonate, silicon carbide, silicon nitride, boron nitride and the like; fine powders of organic resins such as silicone resins, epoxy resins, and fluorine resins, dyes, pigments, flame retardants, heat resistance agents, and the like can be blended in the sealing film.

There are no particular limitations on the thickness of the sealing film but this is, for example, not less than 10 μm, preferably not less 20 μm, and not more than 300 μm, preferably not more than 200 μm.

One optical semiconductor element may be installed, or a plurality of two or more may be installed, on the optical semiconductor element mounting substrate. Preferably, a plurality of optical semiconductor elements are mounted on the optical semiconductor element mounting substrate. When a plurality of optical semiconductor elements are mounted on the optical semiconductor element mounting substrate, it is preferable that the minimum distance between the optical semiconductor elements is greater than the thickness of the sealing film, in order to ensure coverage by the sealing film in a manner that follows the shape of the optical semiconductor element, which is to say, conformal lamination shaping. Therefore, the minimum distance between the optical semiconductor elements is usually not less than 10 μm, and preferably not less than 20 μm. There are no particular limitations on the maximum distance between the optical semiconductor elements, but this is usually less than twice the thickness of the sealing film. Therefore, the maximum distance between the optical semiconductor elements is usually not more than 600 μm, and preferably not more than 400 μm. In order to ensure conformal lamination shaping, this is usually designed so that the aspect ratio (T/L) of the distance from the top surface of the optical semiconductor element to the surface of the optical semiconductor element mounting substrate, which is to say, the height T of the optical semiconductor element, to the distance L between the optical semiconductor elements, is, at a maximum, not more than 3, and more preferably, at a maximum, not more than 2.5, and still more preferably, at a maximum, not more than 2.

The pressure in the pressure reduction chamber can be reduced by a conventional known pressure reduction means, for example, this can be performed by operating a vacuum pump connected to the interior of the pressure reduction chamber. Usually, the pressure in the pressure reduction chamber is reduced to not more than 300 Pa, and preferably not more than 200 Pa, or not more than 133 Pa.

The step of heating the sealing film so as to thermally fuse at least the peripheral portion of the sealing film to the surface of the optical semiconductor element mounting substrate is a step of heating the sealing film to a temperature of not less than $T_1$, so as to soften the sealing film, allowing it to bend, so as to bring the sealing film and the optical semiconductor element mounting substrate into contact with each other, and thermally fuse at least the peripheral portion of the sealing film to the peripheral portion of the region of the optical semiconductor element to be sealed, and thus form a gastight space between the sealing film and the surface of the optical semiconductor element mounting substrate in the region to be sealed. By way of this step, the sealing film is given suitable flexibility for conformal lamination, and the space between the sealing film and the surface of the optical semiconductor element mounting substrate in the region to be sealed can be closed (also referred to as "sealed") to produce a gastight state.

Heating of the sealing film is performed by a heating means provided in the pressure reduction chamber. For example, a heating plate provided in the pressure reduction chamber can be used as the heating means. Normally, the sealing film is heated by heating the optical semiconductor element mounting substrate. For example, if a heating plate is used as the heating means, heat is transferred from the optical semiconductor element mounting substrate to the sealing film, by way of bringing the optical semiconductor element mounting substrate and the heating plate into contact with each other, and thus heating the sealing film.

In this step, the sealing film is held at a temperature which is not less than the temperature $T_1$ and not more than the temperature $T_2$. There are no particular limitations the temperature $T_1$, as long as it is not so high as to cause thermal fusion of the film while reducing the pressure in the chamber such that the region to be sealed cannot be gastightly sealed (air remains trapped), and is 60° C. at the highest. Furthermore, the sealing film is normally held at a temperature of $T_1$ to $T_2$ for not less than 1 minute and not more than 10 minutes. This is because, if held for more than 10 minutes, curing of the sealing film advances, which tends to cause poor lamination.

The step of heating the sealing film so as to thermally fuse at least the peripheral portion of the sealing film to the optical semiconductor element mounting substrate may be performed after step (1) is completed, or may be performed during step (1) before step (1) is completed. That is to say, heating of the sealing film to not less than the temperature $T_1$ may be started before the pressure in the pressure reduction chamber is reduced to the predetermined range. From the viewpoint of the stability of the process, step (2) is preferably performed after reducing the pressure within the pressure reduction chamber in step (1) is completed.

(3) The step of releasing the reduced pressure within the pressure reduction chamber so as to seal the optical semiconductor element mounting substrate with the sealing film is a step of releasing the reduced pressure within the pressure reduction chamber so as to press bond the sealing film against the optical semiconductor element mounting substrate by way of the pressure difference between the gastight space between the sealing film and the surface of the region of the optical semiconductor element mounting substrate to be sealed and the outside air, and thus laminate the optical semiconductor element mounting substrate.

The expression "releasing the reduced pressure within the pressure reduction chamber" normally means opening the pressure reduction chamber to the atmosphere so as to return the reduced pressure in the pressure reduction chamber to atmospheric pressure. It is not necessary that it be returned to atmospheric pressure immediately, but rather the reduced pressure may be gradually released, in a range that allows conformal lamination of the optical semiconductor element by pressure bonding the sealing film against the optical semiconductor element mounting substrate. The reduced pressure in the pressure reduction chamber is normally returned to atmospheric pressure at a rate of 10 kPa/sec, and preferably 50 kPa/sec, or 100 kPa/sec. This is because, if the rate of change from reduced pressure to atmospheric pressure is too slow, the seal may leak and lamination may be incomplete.

The temperature $T_2$ of the optical semiconductor element mounting substrate when the reduced pressure within the pressure reduction chamber is released is set to a temperature at which the sealing film has physical characteristics that are suitable for allowing conformal lamination shaping on the optical semiconductor element. Specifically, the temperature $T_2$ is a temperature at which the sealing film exhibits a tensile strength of 0.02 to 0.15 MPa and an elongation at break of 150 to 450%. Preferably, $T_2$ is a temperature at which the sealing film exhibits a tensile strength of not less than 0.03 MPa. Preferably, $T_2$ is a temperature at which the sealing film exhibits a tensile strength of not more than 0.12 MPa. Preferably, $T_2$ is a temperature at which the sealing film exhibits an elongation at break of not less than 200%. Preferably, $T_2$ is a temperature at which the sealing film exhibits an elongation at break of not more than 400%. The tensile strength and elongation at break of the sealing film are measured in advance by ordinary methods in the present technical field, before implementing the present invention. For example, measurement can be performed using an RSA-G2 dynamic viscoelasticity measurement instrument made by TA Instruments. Because the sealing film exhibits the aforementioned physical characteristics at the temperature $T_2$, the optical semiconductor element mounted on the substrate can be highly reliably sealed.

There are no particular limitations on the temperature $T_2$ of the optical semiconductor element mounting substrate when the reduced pressure within the pressure reduction chamber is released, as long as the aforementioned conditions are satisfied, but this is, for example, not less than 70° C., preferably not less than 90° C., and not more than 180° C., preferably not more than 150° C.

Hereafter, specific modes of embodiment of the present invention will be described in more detail with reference to the drawings.

FIG. 1 is a schematic sectional view showing one example of the production method according to the present invention, which is carried out using a vacuum laminator 10 having a lift-pin elevation mechanism, as the pressure reduction chamber.

FIG. 1(a) illustrates step (1) of the present invention in the present mode of embodiment. In this step (1), a sealing film 3 is placed on an optical semiconductor element mounting substrate 1 on which an optical semiconductor element 2 is mounted. Furthermore, the optical semiconductor element mounting substrate 1 is disposed on a middle plate 12 which can be raised and lowered by lift-pins 13. The interior of the vacuum laminator 10 is connected to a pressure reduction means (not shown) via an opening 14, and the pressure within the vacuum laminator 10 is reduced by operating the pressure reduction means. Here, at the start of step (1), the middle plate 12 is disposed spaced apart from the heating plate 11 by the lift-pins 13, so as to prevent the sealing film 3 from being heated by the heating plate 11 to not less than the temperature $T_1$ before pressure reduction within the vacuum laminator 10 has sufficiently advanced. The stability of the process can thereby be ensured.

FIG. 1(b) illustrates step (2) of the present invention in the present mode of embodiment. In this step (2), the lift-pins 13 are lowered and the middle plate 12 is moved so as to come into contact with the heating plate 11. As a result, heat from the heating plate 11 is transmitted to the sealing film 3 via the optical semiconductor element mounting substrate 1, and the sealing film 3 is heated to a temperature higher than $T_1$. When the sealing film 3 is heated, the sealing film 3 softens and is deformed, such that a peripheral portion 20 of the sealing film 3 comes into contact with the surface of the optical semiconductor element mounting substrate 1, and the peripheral portion 20 is thermally fused to the surface of the semiconductor element mounting substrate 1. At this time, a gastight space 21 is formed between the sealing film 3 and the surface of the region of the optical semiconductor element mounting substrate 1 to be sealed.

FIG. 1(c) illustrates step (3) of the present invention in the present mode of embodiment. In this step (3), when the temperature of the semiconductor element mounting substrate 1 reaches $T_2$, the reduced pressure within the vacuum laminator 10 is released via an opening 14, whereby the sealing film 3 is press bonded against the optical semiconductor element mounting substrate 1 due to the pressure difference between the outside air and the gastight space 21 (not shown in FIG. 1(c)), such that the optical semiconductor element 2 is sealed. As a result, a sealed optical semiconductor device 30 is obtained. In step (3), when the temperature of the optical semiconductor element mounting substrate 1 reaches the temperature $T_2$, which is a temperature at which the sealing film exhibits physical characteristics suitable for allowing conformal lamination shaping on the optical semiconductor element, the reduced pressure within the vacuum laminator 10 is released, whereby a covering using the sealing film 3, which follows the shape of the optical semiconductor element 2, can be highly reliably formed.

FIG. 2 is a schematic cross-sectional view illustrating one example of the production method according to the present invention, which is implemented using a diaphragm-type vacuum laminator 40 as a pressure reduction chamber, and a lamination jig 50.

FIG. 2(a) illustrates step (1) of the present invention in the present mode of embodiment. The interior of the diaphragm-type vacuum laminator 40 is divided into an upper chamber 42 and a lower chamber 43, with a rubber diaphragm membrane 41 therebetween, and the interior of the upper chamber 42 and the lower chamber 43 are connected to a pressure reduction means (not illustrated for either) via openings 15 and 16, respectively, and the pressures within the upper chamber 42 and the lower chamber 43 are reduced by the operation of the pressure reduction means. The opening 15 of the upper chamber 42 may also be connected to a pressurizing means. In this figure, in the lower chamber 43, the sealing film 3 is placed on the optical semiconductor element mounting substrate 1 on which the optical semiconductor element 2 is mounted. Further, the optical semiconductor element mounting substrate 1 is disposed within a specialized lamination jig 50. This lamination jig 50 is provided with springs 51, and the lamination jig 50 is disposed spaced apart from the heating plate 11 by way of the springs 51, such that the sealing film 3 can be prevented from being heated to not less than the temperature $T_1$ by the heating plate 11, before pressure reduction of the lower chamber 43 has sufficiently advanced. The stability of the process can thereby be ensured.

FIG. 2(b) illustrates step (2) of the present invention in the present mode of embodiment. In this step (2), the reduced pressure of the upper chamber 42 is released via the opening 15. As a result, the rubber diaphragm membrane 41 deforms so as to exert pressure on the lower chamber 43 due to the difference in reduced pressure between the upper chamber 42 and the lower chamber 43 (not shown in FIG. 2(b)), and thus exert pressure on the spring 51, such that the lamination jig 11 comes into contact with the heating plate 50. As a result, heat from the heating plate 11 is transmitted to the sealing film 3 via the optical semiconductor element mounting substrate 1, and the sealing film 3 is heated to not less than the temperature $T_1$. When the sealing film 3 is heated to not less than the temperature $T_1$, the sealing film 3 softens so as to be deformed, and the peripheral portion 20 of the sealing film 3 comes into contact with the surface of the optical semiconductor element mounting substrate 1. As a result, the peripheral portion 20 is thermally fused to the surface of the semiconductor element mounting substrate 1, and a gastight space 21 is formed between the sealing film 3 and the surface of the region of the optical semiconductor element mounting substrate 1 to be sealed. In this mode of embodiment, due to the structure of the upper frame 52 of the lamination jig 50, even when the rubber diaphragm membrane 41 exerts pressure on the lower chamber 43, the sealing film 3 can be prevented from being pressed against the semiconductor element mounting substrate 1 by the rubber diaphragm membrane 41, and as a result, formation of the gastight space 21 can be ensured.

FIG. 2(c) illustrates step (3) of the present invention in the present mode of embodiment. In this step (3), when the temperature of the semiconductor element mounting substrate 1 reaches $T_2$, the reduced pressure within the lower chamber 43 is released via an opening 16, whereby the sealing film 3 is press bonded against the optical semiconductor element mounting substrate 1 due to the pressure difference between the outside air and the gastight space 21 (not shown in FIG. 2 (c)), such that the optical semiconductor element 2 is sealed. As a result, a sealed optical semiconductor device 30 is obtained. In step (3), when the temperature of the optical semiconductor element mounting substrate 1 reaches the temperature $T_2$, which is a temperature at which the sealing film 3 exhibits physical characteristics suitable for allowing conformal lamination shaping on the optical semiconductor element 2, the reduced pressure within the lower chamber 43 is released, whereby a covering using the sealing film 3, which follows the shape of the optical semiconductor element 2, can be highly reliably formed.

EXAMPLES

The method for producing a sealed optical semiconductor device of the present invention will be described in detail with reference to examples and comparative examples. However, the present invention is not limited to the description of the following examples.

Sealing Film

YAG-based yellow-emitting phosphor particles (made by Intematix Corporation, trade name NYAG 4454 S, average particle size 8 μm) were mixed in the amounts of 75 mass % and 85 mass % with respect to a thermosetting silicone composition (LF-1200 made by Dow Corning Toray Co. Ltd.) to prepare a sealing film A (containing 75 wt % phosphor particles) and a sealing film B (containing 85 wt % phosphor particles) having thicknesses of 100 μm.

Similarly, YAG-based yellow-emitting phosphor particles (made by Intematix, trade name NYAG 4454 S, average particle size 8 μm) were mixed in the amounts of 75 mass % and 85 mass % with respect to a thermosetting silicone composition (LF-1201 made by Dow Corning Toray Co. Ltd.) to prepare a sealing film C (containing 75 wt % phosphor particles) and a sealing film D (containing 85 wt % phosphor particles) having thicknesses of 100 μm.

The tensile strength and elongation at break of the sealing films A to D at 90° C., 100° C., 110° C., 120° C., and/or 130° C. were measured using an RSA-G2 dynamic viscoelasticity measuring instrument made by TA Instruments. Measurement samples, having a size 10 mm in length and 25 mm in width, were prepared and measured at a tensioning speed of 10 mm/min. The results are shown in Table 1 below.

Optical Semiconductor Element Mounting Substrate

An optical semiconductor element mounting substrate, in which cuboid optical semiconductor elements having a depth of 1 mm, a width of 1 mm, and a height of 0.15 mm were arranged, with 10 elements in the lengthwise direction and 10 elements in the crosswise direction, on a glass substrate, was used as the optical semiconductor element mounting substrate. The distance L between the optical semiconductor elements was uniformly 0.15 mm, and the aspect ratio (T/L) between the height T of the optical semiconductor element and the distance L between the optical semiconductor elements was 1.

Examples 1 to 5 and Comparative Examples 1 to 9

Vacuum lamination was performed on the semiconductor element mounting substrate using the sealing films A to D. A vacuum laminator having a lift-pin elevation mechanism (made by Nisshinbo Mechatronics Corporation, the trade name, PVL-0505S With Lift-Pin Mechanism), which was connected to a vacuum pump, was used as the pressure reduction chamber. First, optical semiconductor element mounting substrates were set on the middle plate, which could be elevated by the lift-pin elevation mechanism, and which was disposed at a position distant from the heating plate in the vacuum laminator, and the sealing films A, B, C, or D were placed thereon. Then, the vacuum pump was driven to reduce the pressure within the vacuum laminator to 133 Pa. Next, the middle plate was lowered into contact with a heating plate that had been heated to 100° C. to 180° C. Thereafter, the sealing film was heated for 3 to 7 minutes and, when the temperature of the optical semiconductor element mounting substrate reached the predetermined temperature $T_2$, the reduced pressure was returned to atmospheric pressure over 10 seconds, to obtain a sealed optical semiconductor device.

The resulting sealed semiconductor device was visually observed to check for the presence of voids and/or cracks. The results are shown in Table 1 below.

TABLE 1

| | sealing film | temperature $T_2$ (° C.) | tensile strength at temperature $T_2$ (MPa) (MPa) | elongation at break at temperature $T_2$ (%) | presence of voids/cracks |
|---|---|---|---|---|---|
| Example 1 | A | 110 | 0.12 | 200 | no |
| Example 2 | A | 120 | 0.05 | 350 | no |
| Example 3 | A | 130 | 0.03 | 400 | no |
| Example 4 | C | 100 | 0.11 | 210 | no |
| Example 5 | C | 110 | 0.06 | 360 | no |
| Comparative Example 1 | A | 100 | 0.20 | 170 | yes |
| Comparative Example 2 | A | 140 | 0.01 | 450 | yes |
| Comparative Example 3 | B | 110 | 0.20 | 10 | yes |
| Comparative Example 4 | B | 120 | 0.18 | 44 | yes |
| Comparative Example 5 | B | 130 | 0.16 | 160 | yes |
| Comparative Example 6 | C | 90 | 0.34 | 106 | yes |
| Comparative Example 7 | C | 120 | 0.01 | 500 | yes |
| Comparative Example 8 | D | 100 | 0.16 | 20 | yes |
| Comparative Example 9 | D | 110 | 0.12 | 100 | yes |

Based on Table 1, it was confirmed that voids and/or cracks did not occur in the sealed optical semiconductor devices produced by the production methods in Examples 1 to 5, and that the sealing film formed a covering that followed the shape of the optical semiconductor elements.

POTENTIAL FOR USE IN INDUSTRY

The method for producing a sealed optical semiconductor device of the present invention is useful as a method of sealing an optical semiconductor element such as a light emitting diode (LED), a semiconductor laser, a photodiode, a phototransistor, a solid-state imaging device, or a light emitter and a light receiver for a photocoupler.

EXPLANATION OF THE REFERENCE NUMERALS 1 optical semiconductor element mounting substrate
2 optical semiconductor element 3 sealing film
10 vacuum laminator
11 heating plate
12 middle plate
13 lift-pin
14 to 16 opening
20 peripheral portion of the sealing film
21 gastight space
30 sealed optical semiconductor device
40 diaphragm-type vacuum laminator
41 rubber diaphragm membrane
42 upper chamber
43 lower chamber
50 lamination jig
51 spring
52 top frame

The invention claimed is:

1. A method for producing a sealed optical semiconductor device including:
- a step of placing a sealing film on an optical semiconductor element mounting substrate on which an optical semiconductor element is mounted, in a pressure reduction chamber, and reducing the pressure within the pressure reduction chamber;
- a step of heating the sealing film so as to thermally fuse at least a peripheral portion of the sealing film to a surface of the element mounting substrate; and
- a step of releasing the reduced pressure within the pressure reduction chamber so as to seal the optical semiconductor element mounting substrate with the sealing film,
- wherein the temperature $T_2$ of the optical semiconductor element mounting substrate when the reduced pressure within the pressure reduction chamber is released is a temperature at which the sealing film exhibits a tensile strength of 0.02 to 0.15 MPa and an elongation at break of 150 to 450%.

2. The method for producing a sealed optical semiconductor device as claimed in claim 1, wherein the sealing film is made of a thermosetting silicone resin.

3. The method for producing a sealed optical semiconductor device as claimed in claim 1, wherein the sealing film contains not more than 90 mass % of a phosphor.

4. The method for producing a sealed optical semiconductor device as claimed in claim 1, wherein the sealing film has a thickness of not less than 10 μm and not more than 300 μm.

5. The method for producing a sealed optical semiconductor device as claimed in claim 1, wherein the temperature $T_2$ is not less than 70° C. and not more than 180° C.

6. The method for producing a sealed optical semiconductor device as claimed in claim 1, wherein the minimum distance between the optical semiconductor elements on the optical semiconductor element mounting substrate is greater than the thickness of the sealing film.

7. The method for producing a sealed optical semiconductor device as claimed in claim 1, wherein the aspect ratio (T/L) between the height T of the optical semiconductor device and the distance L between the optical semiconductor devices on the optical semiconductor element mounting substrate is, at maximum, not more than 3.

8. The method for producing a sealed optical semiconductor device as claimed in claim 2, wherein the sealing film contains not more than 90 mass % of a phosphor.

9. The method for producing a sealed optical semiconductor device as claimed in claim 2, wherein the sealing film has a thickness of not less than 10 μm and not more than 300 μm.

10. The method for producing a sealed optical semiconductor device as claimed in claim 3, wherein the sealing film has a thickness of not less than 10 μm and not more than 300 μm.

11. The method for producing a sealed optical semiconductor device as claimed in claim 2, wherein the temperature $T_2$ is not less than 70° C. and not more than 180° C.

12. The method for producing a sealed optical semiconductor device as claimed in claim 3, wherein the temperature $T_2$ is not less than 70° C. and not more than 180° C.

13. The method for producing a sealed optical semiconductor device as claimed in claim 8, wherein the temperature $T_2$ is not less than 70° C. and not more than 180° C.

14. The method for producing a sealed optical semiconductor device as claimed in claim 2, wherein the minimum distance between the optical semiconductor elements on the optical semiconductor element mounting substrate is greater than the thickness of the sealing film.

15. The method for producing a sealed optical semiconductor device as claimed in claim 3, wherein the minimum distance between the optical semiconductor elements on the optical semiconductor element mounting substrate is greater than the thickness of the sealing film.

16. The method for producing a sealed optical semiconductor device as claimed in claim 2, wherein the aspect ratio (T/L) between the height T of the optical semiconductor device and the distance L between the optical semiconductor devices on the optical semiconductor element mounting substrate is, at maximum, not more than 3.

17. The method for producing a sealed optical semiconductor device as claimed in claim 3, wherein the aspect ratio (T/L) between the height T of the optical semiconductor device and the distance L between the optical semiconductor devices on the optical semiconductor element mounting substrate is, at maximum, not more than 3.

* * * * *